United States Patent

Harada et al.

[11] Patent Number: 5,115,118
[45] Date of Patent: May 19, 1992

[54] HEAT-TREATMENT FURNACE

[75] Inventors: Hiromi Harada, Hiratsuka; Toshihisa Nozawa, Yokohama, both of Japan

[73] Assignee: Tokyo Electron Limited, Tokyo, Japan

[21] Appl. No.: 622,481

[22] Filed: Dec. 5, 1990

[30] Foreign Application Priority Data

Dec. 22, 1989 [JP] Japan .................... 1-333591

[51] Int. Cl.⁵ ............................ F27B 5/14
[52] U.S. Cl. .................... 219/390; 219/405;
219/411; 219/522; 392/408; 392/416; 432/121; 118/725
[58] Field of Search ............ 219/390, 405, 411, 522; 118/50.1, 725; 392/408, 416; 432/121

[56] References Cited

U.S. PATENT DOCUMENTS

| | | | |
|---|---|---|---|
| 3,626,154 | 12/1971 | Reed | 219/411 |
| 3,678,889 | 7/1972 | Murakami et al. | 519/522 |
| 3,972,682 | 8/1976 | Stephens et al. | 219/390 |
| 4,412,812 | 11/1983 | Sadowski et al. | 432/121 |
| 4,699,084 | 10/1987 | Wilson et al. | 118/725 |
| 4,760,244 | 7/1988 | Hokynar | 219/390 |
| 4,849,608 | 7/1989 | Muraoka et al. | 219/390 |
| 4,950,870 | 8/1990 | Mitsuhashi et al. | 219/390 |
| 4,954,685 | 9/1990 | Kumagai et al. | 219/390 |

Primary Examiner—Bruce A. Reynolds
Assistant Examiner—Tu Hoang
Attorney, Agent, or Firm—Oblon, Spivak, McClelland, Maier & Neustadt

[57] ABSTRACT

A heat-treatment furnace comprising a process tube for containing an object of treatment, a heater surrounding the process tube, and an infrared impermeable member located on the process tube side of the heater and at least one the side of an open end of the process tube through which the object of treatment is carried in and out.

7 Claims, 3 Drawing Sheets

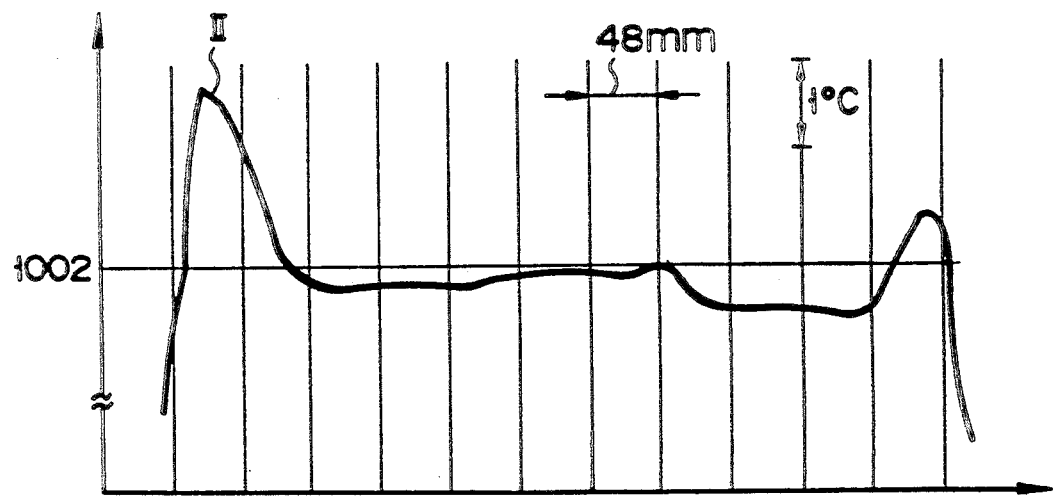
F I G. 5

HEAT-TREATMENT FURNACE

BACKGROUND OF THE INVENTION

1. Field of the Invention

The present invention relates to a heat-treatment furnace.

2. Description of the Related Art

In a process for manufacturing a semiconductor device, wafers as objects to be treated are carried into a heat-treatment furnace, such as a horizontal or vertical furnace, to be subjected to heat treatment therein. The heat-treatment furnace of this type comprises a process tube for containing process gas, an electrically-operated heater disposed around the process tube, and an adiabatic member covering the heater.

Conventionally, the process tube is of a batch type such that a large number of wafers are contained in the tube so as to be arranged in the longitudinal direction of the tube. Accordingly, the region for containing the wafers must be made to be an isothermal zone which is kept at a constant temperature. In order to maintain the uniformity of the treatment for the wafers, more specifically, the range of temperature fluctuations in the isothermal zone must be restricted within plus or minus 0.5° C.

In the conventional heat-treatment furnace, therefore, the heater is divided, for example, into three or five temperature control zones, along the longitudinal direction of the process tube. In this case, a temperature profile along the longitudinal direction of the process tube is uneven, as indicated by characteristic curve I in FIG. 4. As a measure for improving such an uneven temperature profile, a soaking tube formed of SiC or the like is conventionally interposed between the process tube and the heater, besides the aforesaid temperature control system (Published Unexamined Japanese Patent Application No. 60-148124).

In a heat-treatment furnace with the soaking tube, however, one end portion of the process tube is opened to serve as a furnace opening through which the wafers are carried in and out, so that the opening portion is located in a temperature gradient zone even though the opening is closed during the treatment. Thus, this temperature profile is subject to a problem such that heat escapes from the furnace through the furnace opening portion, thereby entailing a temperature drop, as indicated by characteristic curve II in FIG. 5. In order to prevent such heat radiation, the heating temperature of heater elements on the side closer to the open end of the process tube is set relatively high. If the heating temperature of specific heater elements is increased, however, the temperature of the central portion of the process tube fluctuates, so that the isothermal zone is shortened. As a result, batch-type heat treatment will produce plenty of defects.

Even though the soaking tube of SiC or the like is interposed between the heater and the process tube, moreover, it cannot be very conducive to the prevention of dispersion of the temperature profile on the open end side of the isothermal zone. The soaking tube is better serviceable for the prevention of contamination than for the maintenance of the isothermal zone length. More specifically, dust from the adiabatic member, heater, etc. enters the process tube through its wall, thereby lowering the yield of treatment. With use of the soaking tube disposed outside the process tube, however, the amount of dust transmitted through the tube can be reduced. Thus, the conventional soaking tube cannot effectively prevent heat from escaping from the heater toward the open end of the furnace.

SUMMARY OF THE INVENTION

The object of the present invention is to provide a heat-treatment furnace in which the amount of heat radiated toward a furnace opening is controlled to reduce dispersion of temperature profiles in the furnace, thereby lengthening isothermal zones.

According to the present invention, there is provided a heat-treatment furnace which comprises a process tube for containing an object of treatment, a heater surrounding the process tube, and an infrared impermeable member located on the process tube side of the heater and at least on the side of an open end of the process tube through which the object of treatment is carried in and out.

The infrared impermeable member may be of any material whose permeability to infrared rays is very low and which can satisfactorily scatter and absorb infrared rays.

According to the present invention, the infrared impermeable member is located between the process tube and the heater, on the furnace opening side, so that the amount of infrared rays radiated directly from the heater toward the furnace opening can be lessened to reduce dispersion of temperature profiles in isothermal zones. The following is the reason for this. The preset temperature of the heater normally ranges from 600° C. to 1,000° C. or thereabout. Within this temperature range, most of energy distributed in the process tube has an infrared wavelength. Meanwhile, the radiation of the infrared rays from the heater toward the furnace opening can be prevented by means of the infrared scattering and absorbing effects of the infrared impermeable member, so that the isothermal zone length can be practically extended.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4 and 5 show characteristic curves representing in-furnace temperature profiles obtained with use of prior art heat-treatment furnaces.

DETAILED DESCRIPTION OF THE PREFERRED EMBODIMENTS

One embodiment of the present invention applied to a horizontal furnace will now be described in detail with reference to the accompanying drawings.

Figure 1:
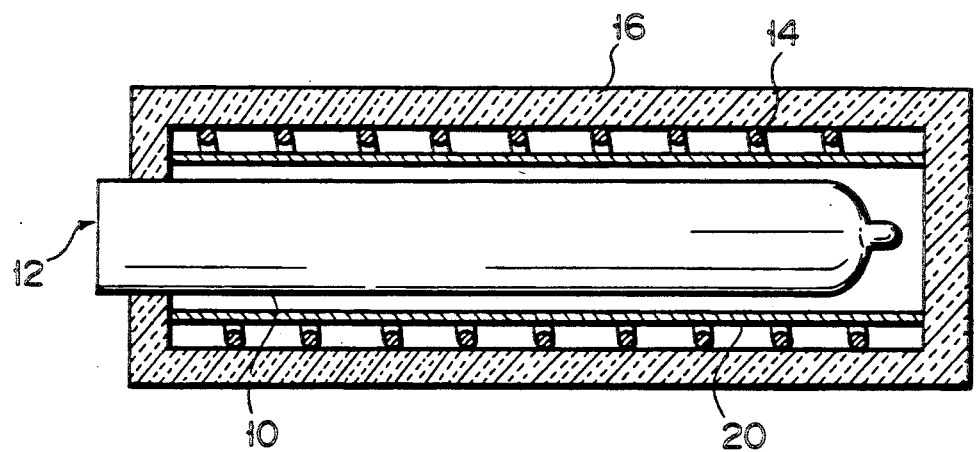
FIG. 1 is a schematic sectional view showing one embodiment of the present invention which is applied to a horizontal furnace.

FIG. 1 a sectional view showing an arrangement of a horizontal furnace. This furnace comprises a cylindrical process tube 10 of quartz or the like, which is closed at one end. An opening portion 12 for loading and unloading wafers (not shown) to be heat-treated is provided at the other end portion of the tube 10. The wafers can be loaded into the process tube 10 through the opening portion 12 by a so-called soft-landing method or cantilever method.

A heater 14 of, e.g., an electric-resistance heating type is arranged along the longitudinal direction of the process tube 10 so as to surround the same. In order to secure a long isothermal region, the heater 14 is adapted for independent temperature control for each of three zones (or five zones). A cylindrical adiabatic member 16 is disposed surrounding the tube 10 and the heater 14.

A soaking tube 20 formed of e.g. alumina ($Al_2O_3$) is disposed between the process tube 10 and the heater 14, inside the adiabatic member 16. Alumina, which constitutes the tube 20, is a sintered material having a sectional structure such that a large number of alumina particles are arranged at random. The alumina particles, which are combined with one another, are different in size. When infrared rays are applied to the soaking tube 20 formed these alumina particles, they are scattered in various directions by the randomly arranged alumina particles as they are transmitted through the tube 20.

The preset temperature of the heater 14 is adjusted to a value which can provide a processing temperature range of 600° C. to 1,000° C. Within this temperature range, a great deal of infrared energy is distributed in the process tube 10. More specifically, heat radiated from that portion of the heater 14 which is situated close to the opening portion 12 of the tube 10 causes the energy portion having an infrared wavelength to be scattered in various directions by the soaking tube 20. Accordingly, the amount of heat radiated directly toward the opening portion 12 can be restricted to a value smaller enough than in the case of a conventional heat-treatment apparatus.

By thus reducing the amount of heat radiated toward the opening portion 12, out of the heat in the process tube 10, dispersion of temperature profiles in the isothermal zones can be reduced, so that the length of the isothermal zones can be made practically longer than in the conventional case. Heat radiation is caused also on the side of the closed end of the process tube 10, which is a heater end. For the same reason as aforesaid, however, the heat radiation at the closed end portion of the tube 10 can be restrained by means of the soaking tube 20. Also in the other region than the area close to the opening portion 12 of the process tube 10, moreover, heat radiated from the heater 14 toward the tube 10 is previously scattered and absorbed by the soaking tube 20. The uniformity of the heating temperature in the isothermal zones can be satisfactorily maintained by such scattering and absorption of the infrared rays.

Figure 2:
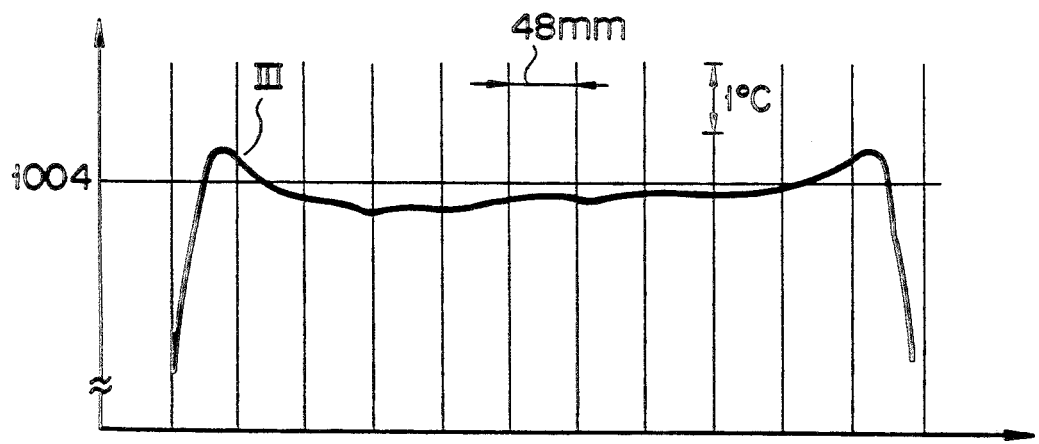
FIG. 2 shows a characteristic curve representing an in-furnace temperature profile obtained with use of a heat-treatment furnace to which the invention is applied.

In order to verify the effect of the present invention, an experimental furnace with a length of about 770 mm was prepared as the process tube 10, the soaking tube 20 of alumina was disposed so as to surround the tube 10, and the heater 14 and the adiabatic member 16 were arranged in succession outside the the tube 10. Thus, the heat-treatment furnace was assembled, as shown in FIG. 1. Then, thermocouples are arranged at predetermined intervals along the longitudinal direction of the process tube 10, and temperature profiles of the tube 10 at the respective positions of the thermocouples were measured. Thus, temperature characteristic curve III was obtained, as shown in FIG. 2. It was confirmed, as seen from curve III, that isothermal zones of substantially uniform temperatures within plus or minus 0.5° C., that is, within a temperature range of 1° C., which are required of a conventional heat-treatment furnace, were formed substantially throughout the process tube 10.

The length of the isothermal zones was able to be made longer than in the case of the conventional heat-treatment furnace because the amount of infrared rays radiated toward the opening portion 12 of the process tube 10 was greatly restricted by the arrangement of the soaking tube 20.

It is to be understood that the present invention is not limited to the embodiment described above, and that various changes and modifications may be effected therein by one skilled in the art without departing from the scope or spirit of the invention.

The dispersion of the temperature in the furnace, attributable to heat radiation toward the furnace opening, is particularly noticeable in the case of a horizontal furnace. The inventors hereof, however, experimentally confirmed that the isothermal zones can be also lengthened by applying the present invention to the case of a vertical furnace in which the axis of the process tube 10 extends in the vertical direction.

Further, an infrared impermeable member for scattering and absorbing infrared rays is preferably formed of a sintered material, such as alumina, whose particles are arranged at random and whose particle size is relatively large. Besides such a sintered material, however, any materials may be used for this purpose provided that they can produce the same effect as aforesaid.

Figure 3:
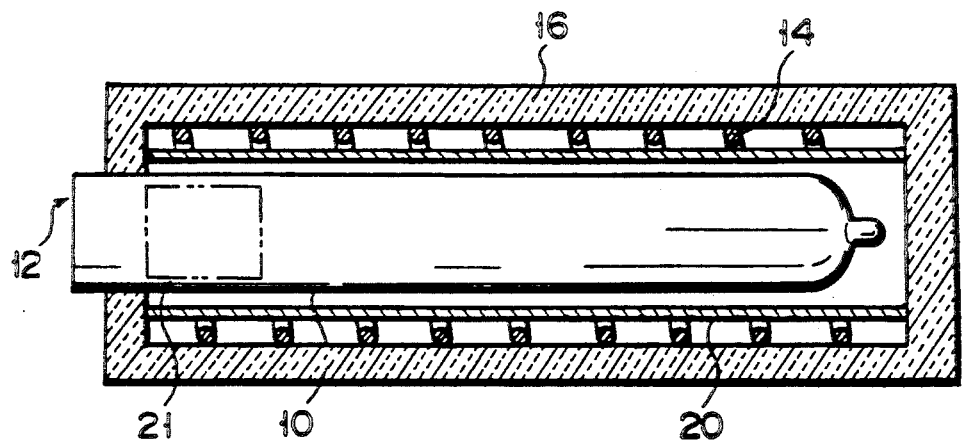
FIG. 3 is a sectional view showing another embodiment of the present invention.
Figure 4:
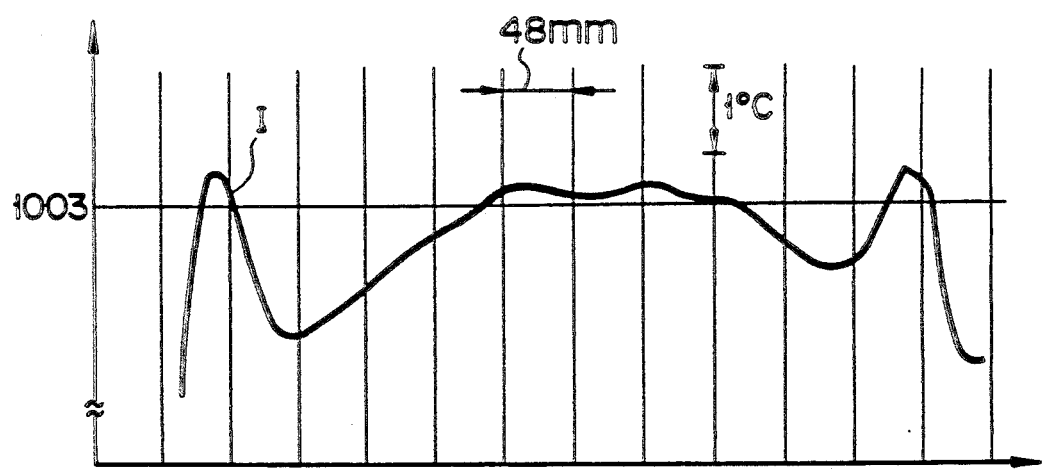

As mentioned before, the dispersion of the temperature profiles in the furnace is attributable to the heat radiation from the heater to the furnace opening. Accordingly, the effect of the present invention can be obtained by only interposing an infrared impermeable member 21, which can at least scatter and absorb infrared rays, between the heater and the furnace opening, as shown in FIG. 3, instead of arranging the soaking tube 20 of alumina around the process tube 10.

According to the present invention, as described above, there may be provided a heat-treatment furnace in which the member for scattering and absorbing infrared rays is disposed between the process tube and the heater, at least on the side of the opening portion through which the object of treatment is carried in and out, so that the amount of heat radiated from the heater to the opening portion can be controlled to reduce the dispersion of the temperature profiles in the furnace, thereby lengthening the isothermal zones.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat-treatment furnace, comprising:

a process tube for containing objects to be heat-treated, said process tube having an open end through which said object is carried in said process tube or out of said process tube, said process tube having a soaking zone in which said objects are to be arranged;

a heater surrounding the process tube; and an infrared impermeable member for suppressing infrared radiation from said heater toward said open end of said process tube and enlarging said soaking zone, said infrared impermeable member being removably located inside said process tube and at least on a portion corresponding to said open end of said process tube.

2. The heat-treatment furnace according to claim 1, wherein said infrared impermeable member is formed of a material which reflects and absorbs infrared rays.

3. The heat-treatment furnace according to claim 2, wherein said infrared impermeable member is formed of a large number of alumina particles or titanium dioxide particles, arranged at random.

4. The heat-treatment furnace according to claim 1, wherein a soaking tube is interposed between the process tube and the heater.

5. The heat-treatment furnace according to claim 4, wherein said infrared impermeable member constitutes at least part of the soaking tube.

6. The heat-treatment furnace according to claim 1, wherein an adiabatic member for insulating heat of said heater is provided surrounding the heater.

7. The heat-treatment furnace according to claim 1, wherein said infrared impermeable member is removably set on said portion corresponding to said open end of said process tube, and said process tube has another end different from said open end, said another end being closed.

* * * * *